(12) United States Patent
Klee et al.

(10) Patent No.: US 12,174,258 B2
(45) Date of Patent: Dec. 24, 2024

(54) INDICATOR DEVICE FOR A RECHARGEABLE BATTERY PACK

(71) Applicant: Robert Bosch GmbH, Stuttgart (DE)

(72) Inventors: Christoph Klee, Stuttgart (DE); Mickael Segret, Stuttgart (DE)

(73) Assignee: ROBERT BOSCH GMBH, Stuttgart (DE)

( * ) Notice: Subject to any disclaimer, the term of this patent is extended or adjusted under 35 U.S.C. 154(b) by 255 days.

(21) Appl. No.: 17/287,286

(22) PCT Filed: Sep. 23, 2019

(86) PCT No.: PCT/EP2019/075496
§ 371 (c)(1),
(2) Date: Apr. 21, 2021

(87) PCT Pub. No.: WO2020/069892
PCT Pub. Date: Apr. 9, 2020

(65) Prior Publication Data
US 2021/0396813 A1    Dec. 23, 2021

(30) Foreign Application Priority Data
Oct. 2, 2018   (DE) .......................... 102018216937.3

(51) Int. Cl.
*G01R 31/36*    (2020.01)
*G01R 31/3835*  (2019.01)
(Continued)

(52) U.S. Cl.
CPC ..... *G01R 31/3646* (2019.01); *G01R 31/3835* (2019.01); *H01M 10/425* (2013.01);
(Continued)

(58) Field of Classification Search
None
See application file for complete search history.

(56) References Cited

U.S. PATENT DOCUMENTS 3,796,951 A    3/1974 Joseph
4,743,897 A    5/1988 Perez
(Continued)

FOREIGN PATENT DOCUMENTS

CN    204903736 U    12/2015
EP      1906711 A1    4/2008
WO   2018145324 A1    8/2018

OTHER PUBLICATIONS

International Search Report for PCT/EP2019/075496, Issued Mar. 3, 2019.
(Continued)

*Primary Examiner* — Roy Y Yi
(74) *Attorney, Agent, or Firm* — NORTON ROSE FULBRIGHT US LLP; Gerard A. Messina

(57) ABSTRACT

An indicator device for a rechargeable battery pack, in particular, a rechargeable battery pack of a power tool, for indicating a charge state of the rechargeable battery pack, including at least one charge state indicator unit, which includes at least one indicator element for indicating the charge state of the rechargeable battery pack, and including at least one control line for transmitting at least one electrical and/or electronic signal, in particular, as a function of a charge state of the rechargeable battery pack, from a separate control unit of the rechargeable battery pack, in particular, structurally separated with respect to the charge state indicator unit, in particular, from main control electronics of the rechargeable battery pack to the charge state indicator unit. The charge state indicator unit is configured to short-circuit at least one indicator element as a function of the electrical and/or electronic signals transmitted via the control line.

10 Claims, 9 Drawing Sheets

(51) Int. Cl.
H01M 10/42 (2006.01)
H01M 10/48 (2006.01)
H01M 50/204 (2021.01)
H02J 7/00 (2006.01)

(52) U.S. Cl.
CPC ....... H01M 10/488 (2013.01); H01M 50/204 (2021.01); H02J 7/0044 (2013.01); *H01M 2010/4278* (2013.01); *H01M 2220/30* (2013.01)

(56) References Cited

U.S. PATENT DOCUMENTS

| | | | |
|---|---|---|---|
| 2004/0046673 | A1 | 3/2004 | Kovarik et al. |
| 2006/0197722 | A1 | 9/2006 | Nakajima |
| 2007/0108941 | A1* | 5/2007 | Sainomoto .......... H02J 7/00302 320/112 |
| 2012/0162840 | A1* | 6/2012 | Noda .................. H02J 7/00304 361/78 |
| 2014/0151079 | A1* | 6/2014 | Furui .................... H02J 7/0042 173/171 |
| 2015/0022335 | A1 | 1/2015 | Reinprecht |
| 2016/0172722 | A1* | 6/2016 | Rejman ............... H01M 10/425 429/7 |
| 2016/0226278 | A1* | 8/2016 | Wenger ................ H02J 7/0044 |

OTHER PUBLICATIONS

Peter Cheung "Lecture 7: Digital-to-Analogue Conversion" Department of Electrical and Electronic Engineering Imperial College London. Nov. 13, 2011. 8 pages.

* cited by examiner

INDICATOR DEVICE FOR A RECHARGEABLE BATTERY PACK

BACKGROUND INFORMATION

An indicator device for a rechargeable battery pack, in particular, for a rechargeable battery pack of a power tool, for indicating a charge state of the rechargeable battery pack, including at least one charge state indicator unit that includes at least one indicator element for indicating the charge state of the rechargeable battery pack, and including at least one control line for transmitting at least one electrical and/or electronic signal as a function, in particular, of a charge state of the rechargeable battery pack, from a separate control unit of the rechargeable battery pack, in particular, structurally separated with respect to the charge state indicator unit, in particular, from main control electronics of the rechargeable battery pack, to the charge state indicator unit, has already been provided.

SUMMARY

The present invention is directed to an indicator unit for a rechargeable battery pack, in particular, for a rechargeable battery pack of a power tool, for indicating a charge state of the rechargeable battery pack, including one charge state indicator unit, which includes at least one charge state indicator unit that includes at least one indicator element for indicating the charge state of the rechargeable battery pack, and at least one control line for transmitting at least one electrical and/or electronic signal as a function, in particular, of a charge state of the rechargeable battery pack, from a separate control unit of the rechargeable battery pack, in particular, structurally separated with respect to the charge state indicator unit, in particular, from main control electronics of the rechargeable battery pack, to the charge state indicator unit.

In accordance with an example embodiment of the present invention, it is provided that the charge state indicator unit is configured to short-circuit at least the one indicator element as a function of the electrical and/or electronic signal transmitted via the control line. The indicator device for indicating a charge state of the rechargeable battery pack preferably includes at least one charge state indicator unit, which includes at least one indicator element for indicating the charge state of the rechargeable battery pack, and at least one control line for transmitting at least one electrical and/or electronic signal from a control unit of the rechargeable battery pack separate with respect to the charge state indicator unit to the charge state indicator unit.

In accordance with an example embodiment of the present invention, the indicator unit is advantageously configured, in particular, at least as a function of a pack voltage of the rechargeable battery pack, to output a charge state of the rechargeable battery pack via the at least one indicator element. A user is preferably shown, via a ratio of a number of short-circuited indicator elements to a total number of indicator elements, a proportional charge state of the rechargeable battery pack. The indicator unit is advantageously situated at least partially at an outer wall of a housing of the rechargeable battery pack. The indicator device is preferably situated in and/or at the housing of the rechargeable battery pack in such a way that at least the indicator element, in particular, in a state of the rechargeable battery pack situated in the rechargeable battery-operated device, is accessible and/or visible to the user. The indicator device is designed, in particular, spatially separate or spaced apart from the rest of the electronics, in particular, from the control unit of the rechargeable battery pack and/or from the main control electronics of the rechargeable battery pack. At least the control line preferably connects the indicator device, in particular, conductively, to the rest of the electronics, in particular, to the control unit of the rechargeable battery pack and/or to the main control electronics of the rechargeable battery pack. The control unit of the rechargeable battery pack is preferably configured to control the indicator device with the aid of the electrical and/or electronic signal.

The electrical and/or electronic signal is preferably designed as a voltage level and/or current level. The electrical and/or electronic signal is preferably generated by the control unit of the rechargeable battery pack, in particular, by the main control electronics of the rechargeable battery pack, as a function of a charge state of the rechargeable battery pack. "Configured" is understood to mean, in particular, specifically programmed, designed and/or equipped. That an object is configured for a particular function is understood to mean, in particular, that the object fulfills and/or carries out this function in at least one application state and/or operating state. "Short-circuiting" is understood to mean, in particular, a bridging of an electrical element with the aid of a connection of two electrical lines of an electric circuit, at least a major portion of a current flowing via the electrical lines and a current through the electrical element, in particular, through a high electrical resistance of the electrical element, being at least essentially negligible as compared to the electrical lines. "At least essentially negligible" is understood in this context to mean, in particular, that a value is so low, particularly preferably close to zero, that a measurement and/or function of the value within a device produces no visible and/or otherwise identifiable effect and/or reaction. The current, which flows via the indicator element as a result of the short-circuiting of the indicator element, is preferably so low that the indicator element is not activated.

In accordance with an example embodiment of the present invention, the charge state indicator unit advantageously includes at least more than one indicator element. The charge state indicator element preferably includes exactly three indicator elements. It is also possible, however, that the charge state indicator unit includes a number of indicator elements differing from exactly three, such as for example, exactly four, exactly five or more indicator elements. The at least one indicator element is advantageously designed as a light-emitting diode (LED) and/or LED light element, in particular, LED light strip. Other designs of the indicator element known to those skilled in the art are, however, also possible. The charge state indicator unit includes, in particular, at least one resistor, at least one indicator element and at least one switch element for short-circuiting the indicator device as a function of the electrical and/or electronic signal transmitted via the control line.

In accordance with an example embodiment of the present invention, the indicator device advantageously includes exactly three lines, which connect the indicator device, in particular, the charge state indicator unit of the indicator device at least to the rest of the electronics of the rechargeable battery pack. It is also possible, however, that the indicator device, in particular, the charge state indicator unit, includes a number of lines differing from three, in order to connect the indicator device, in particular, the charge state indicator unit, to the rest of the electronics of the rechargeable battery pack. The indicator device advantageously includes exactly one control line, exactly one supply line and exactly one ground line. The supply line, in particular, connects the indicator device, in particular, the charge state indicator unit of the indicator device, to at least one energy storage unit of the rechargeable battery pack, in particular, in order to provide a pack voltage, which is at least a function of the charge state of the rechargeable battery pack. The ground line preferably connects the indicator device, in particular, the charge state indicator unit of the indicator device, at least to a ground as a zero potential, in particular, to an earth electrode and/or to a protective conducting net of the rechargeable battery pack or of a power tool connected to the rechargeable battery pack.

The design of the indicator device according to the present invention may advantageously enable a simple, compact and simultaneously flexibly positional indicator unit at advantageously low costs, in particular, since expensive components such as, for example, electrical connections for activating individual indicator elements or components for separately measuring a pack voltage of the rechargeable battery pack may be saved.

In accordance with an example embodiment of the present invention, it is also provided that the charge state indicator unit includes at least one transistor element, which is situated so as to be connected in parallel with the indicator element, and is configured to short-circuit at least the indicator element as a function of an electrical and/or electronic signal transmitted via the control line. The transistor element is designed preferably as at least one transistor, at least one bipolar transistor or at least one field-effect transistor. The transistor element is advantageously connected by the electrical and/or electronic signal via the control line. At least the indicator element is short-circuited via a circuit of the transistor element. The transistor element is advantageously situated in such a way that a conductor mesh is designed free of components except for the indicator element and the transistor element. It is possible, however, that the conductor mesh includes at least one resistor between the indicator element and the transistor element. A "conductor mesh" is understood to mean, in particular, a closed line made up of arbitrary electrical components, the conductor mesh being able to be connected via an arbitrary number of node points to other conductive components. If multiple indicator elements are provided, the charge state unit preferably includes one transistor element for each indicator element. An advantageously simple and compact indicator device may be achieved by the design according to the present invention, since a measurement of the pack voltage of the rechargeable battery pack, in particular, may be omitted and all indicator elements may be controlled via one signal.

In accordance with an example embodiment of the present invention, it is also provided that the indicator device includes at least two control resistors electro-conductively connected to the control line, each of which is connected, in particular, directly, to at least one signal output of the control unit of the rechargeable battery pack. A "control resistor" is understood, in particular, to mean a bipolar passive electrical component for implementing an ohmic resistance in an electrical and/or electronic circuit, which changes at least significantly, in particular, in the control line, a signal for controlling an electrical component, in particular, of the charge state indicator unit. "Changes at least significantly" is understood to mean, in particular, that a parameter and/or a value of a signal and/or of a measurement is/are changed by at least 20%, preferably 30% and particularly preferably 40% of its original size. The control resistances are preferably configured to generate at least more than one different electrical and/or electronic signal from at least two voltage levels of the signal outputs of the control unit of the rechargeable battery pack for controlling the charge state indicator unit. Exactly one voltage level is preferably output from one signal output each of the control unit of the rechargeable battery pack, in particular, as a function of a charge state of the rechargeable battery pack. The control resistors are advantageously configured to generate from the exactly two respective voltage levels of the control unit of the rechargeable battery pack exactly four different electrical and/or electronic signals, in particular, exactly four different voltage levels, for controlling the charge state indicator unit. It is also possible, however, that the control resistors generate from a number of voltage levels of the control unit differing from exactly two voltage levels a number of voltage levels differing from exactly four voltage levels for controlling the charge state indicator unit. An advantageously high speed and reliability of the indicator device may be enabled by the design according to the present invention, since a desired voltage level for controlling the charge state indicator unit may be more quickly generated such as, for example, with the aid of a charging and discharging of a capacitor. An advantageously low processor load of the control unit of the rechargeable battery pack may also be achieved by the design according to the present invention.

In accordance with an example embodiment of the present invention, it is further provided that the indicator device includes at least one operating unit, which includes at least one operating element, which is configured to activate the charge state indicator unit via the control unit of the rechargeable battery pack, in particular, via the main control electronics of the rechargeable battery pack. The operating unit is advantageously connected at least to the supply line and to the control line. The operating element is situated preferably between the supply line and the ground line. The operating element is designed preferably as a switch, push button and/or lever. However, other designs of the operating element that appear meaningful to those skilled in the art are also possible. The operating unit advantageously includes, in particular, in addition to the operating element, at least one transistor and at least one resistor. In addition or alternatively, it is possible that the operating unit also includes, in particular, in addition to the operating element, at least one diode, which is configured, in particular, to limit a voltage drop at the resistor of the operating unit, in particular, in order to reduce a lowering of the pack voltage of the rechargeable battery pack and/or to reduce a decreasing thermal output. The operating unit preferably includes two serially connected diodes. The transistor of the operating unit is preferably connected during an actuation of the operating element, as a result of which at least one voltage level at the control unit of the rechargeable battery pack is changed, in particular, at least one voltage level at the signal output of the control unit of the rechargeable battery pack being output, in particular, in order to activate the charge state indicator unit via the control line. An advantageously reliable and error-free indicator device having an advantageously high user-friendliness and an advantageously low power consumption may be enabled by the design according to the present invention, in particular, since an overall voltage drop at resistors during an operation may be reduced with the aid of the operating unit. With the aid of the alternative design including the serially connected diodes, a disruptive power loss within the indicator device may also be reduced. It may also be ensured by the design according to the present invention that the pack voltage is sufficient for at least essentially all charge states of the rechargeable battery pack for supplying the indicator elements.

In addition, it is provided that the charge state indicator unit includes at least one voltage stabilization unit, which includes at least one Zener diode. The voltage stabilization unit is preferably designed at least between the supply line and the rest of the charge state indicator unit. The voltage stabilization unit is preferably configured to reduce a decreasing thermal output of the charge state indicator unit. The voltage stabilization unit is preferably configured to prevent a current flow in an idle state of the charge state indicator unit. The Zener diode is advantageously situated in the reverse direction with respect to the supply line. It is also possible, however, that in addition to the Zener diode, the voltage stabilization unit includes a transistor and a resistor connected in parallel to the Zener diode, the transistor, in particular, being connected via the resistor and the Zener diode and, when connected, a pack voltage of the rechargeable battery pack being present at the rest of the charge state indicator unit. The design according to the present invention may enable an indicator device that has an advantageously low power consumption, in particular, since a voltage on the supply line may be limited by the Zener diode. In addition, the dipping power may be distributed between multiple components, in particular, the Zener diode, the transistor and the resistor as a result of the design according to the present invention.

In addition, in accordance with an example embodiment of the present invention, it is provided that the charge state indicator unit includes at least one redistribution resistor, which is configured to distribute the power drop within the charge state indicator unit, the redistribution resistor being situated between the indicator element and a transistor element of the charge state indicator unit. A "redistribution resistor" is understood to mean, in particular, a bipolar passive electrical component for implementing an ohmic resistance in an electrical and/or electronic circuit, via which a dipping power at the electrical and/or electronic circuit, in particular, as a result of heat, is distributed within the electrical and/or electronic circuits to at least two components, in particular, resistors. The redistribution resistor is preferably designed in a conductor mesh including the indicator element and the transistor element. The charge state indicator unit, in the event that multiple indicator elements are provided, includes one redistribution resistor at least for each indicator element. Alternatively or in addition to the at least one redistribution resistor, at least one additional transistor may be used in the charge state indicator unit, which is configured to distribute an electrical current for supplying the at least one indicator element, and thereby also a dipping power as heat, to multiple points within the indicator device. An advantageously safe indicator device may be achieved by the design according to the present invention, since a power converted to heat, in particular, by the at least one redistribution resistor, is distributed to multiple points within the indicator device. In this way, a local overheating within the rechargeable battery pack may be avoided which may frequently result in damage to the rechargeable battery pack, to a tool operated with the rechargeable battery pack and/or to a user.

A rechargeable battery pack, in particular, a rechargeable battery pack of a power tool, including at least one control unit, in particular, main control electronics, and including at least one indicator device according to the present invention, is also provided in accordance with an example embodiment of the present invention. The control unit of the rechargeable battery pack, in particular, the main control electronics of the rechargeable battery pack, is preferably connected, in particular, conductively, to the indicator device. The indicator device is advantageously situated at least partially at an outer wall of the rechargeable battery pack. At least one indicator element of the indicator device is preferably situated at the outer wall of the rechargeable battery pack, in particular, situated in such a way that the indicator element in an installed stated of the rechargeable battery pack is easily visible and/or accessible to a user. The rechargeable battery pack advantageously includes at least one energy storage unit, which is connected at least temporarily, in particular, conductively, in particular, to the control unit of the rechargeable battery pack, in particular, to the main control electronics of the rechargeable battery pack and to the indicator device. The energy storage unit preferably provides at least one pack voltage as a function of the charge state, which is present at least at the indicator device and/or at the control unit of the rechargeable battery pack, in particular, at the main control electronics of the rechargeable battery pack. The indicator device is advantageously configured to output at least one instantaneous charge state of the rechargeable battery pack by short-circuiting at least one indicator element of the indicator device. The indicator element is preferably short-circuited as a function of the instantaneous charge state of the rechargeable battery pack. The indicator device preferably includes at least two, in particular, exactly 3, exactly 4 or exactly 5 indicator elements, an increasing number of indicator elements, in particular, in identical proportions to a total number of indicator elements, as the proportion of the instantaneous charge state of the rechargeable battery pack to a maximum rechargeable battery capacity being short-circuited, in particular, with a decrease in the instantaneous charge state of the rechargeable battery pack. An advantageously safe and compact rechargeable battery pack may be achieved at advantageously low costs by the design of the rechargeable battery pack according to the present invention including the indicator device.

The present invention is further directed to a method for indicating a charge state of a rechargeable battery pack, in particular, of a rechargeable battery pack of a power tool, with the aid of at least one indicator device according to the present invention. In accordance with an example embodiment of the present invention, it is provided that in at least one method step at least one indicator element of a charge state indicator unit is short-circuited as a function of an electrical and/or electronic signal of a separate control unit of the rechargeable battery pack, in particular, structurally separated with respect to the charge state indicator unit, in particular, of main control electronics of the rechargeable battery pack, transmitted via a control line, in particular, as a function of a charge state of the rechargeable battery.

The indication of the charge state of the rechargeable battery pack, in particular, of a proportional charge state of the rechargeable battery pack via a ratio of a number of short-circuited indicator elements to a total number of indicator elements of the indicator device, advantageously takes place with the aid of the method. A short-circuiting of the indicator element preferably takes place when a pack voltage of the rechargeable battery pack drops below a predefined and/or dynamically ascertained limiting value. The limiting value is preferably designed as a percentage portion of a maximum capacity of the rechargeable battery pack. An advantageously simple indication of the charge state may be enabled at advantageously low costs by the design of the method according to the present invention. An advantageously cost-effective method for indicating the charge state may also be achieved by the design according to the present invention, in particular, since expensive components such as, for example, electrical connections for activating individual indicator elements or components for separately measuring a pack voltage of the rechargeable battery pack may be saved.

In accordance with an example embodiment of the present invention, it is also provided that in at least one method step at least more than one different electrical and/or electronic signal for controlling the charge state indicator unit is generated from at least two voltage levels of the control unit of the rechargeable battery pack, in particular, of the main control electronics of the rechargeable battery pack with the aid of at least two control resistors. A generation of the different electrical and/or electronic signals for controlling the charge state indicator unit from at least two voltage levels of the control unit of the rechargeable battery pack with the aid of the control resistors advantageously takes place passively, in particular, as soon as the voltage levels are applied at signal outputs of the control unit of the rechargeable battery pack. The design according to the present invention may enable an advantageously rapid indication of the charge state since, in particular, a charging and discharging of a capacitor for generating the different signals may be omitted.

In accordance with an example embodiment of the present invention, it is further provided that a short-circuiting of the indicator element takes place via at least one transistor element of the charge state indictor unit, which is connected as a function of the electrical and/or electronic signal of the control unit of the rechargeable battery pack. The connection of the transistor element preferably takes place with the aid of the electrical and/or electronic signal as a function of the charge state of the rechargeable battery pack. In the event multiple indicator elements are used for carrying out the method, the short-circuiting of an indicator element advantageously takes place in each case with the aid of a transistor element. Each transistor element is connected, in particular, via a different voltage level of the electrical and/or electronic signal. A higher voltage level of the electrical and/or electronic signal preferably corresponds to a lower charge state of the rechargeable battery pack relative to an original state with an at least essentially fully charged rechargeable battery pack, as a result of which a higher number of indicator elements are short-circuited, in particular, at a lower charge state of the rechargeable battery pack. An advantageously simple, energy-saving and cost-efficient indication of the charge state may be enabled by the design according to the present invention, since a separate activation of indicator elements, in particular, may be omitted.

It is also provided that the charge state indicator unit is supplied with current via at least one supply line with the aid of at least one pack voltage of the rechargeable battery pack. The pack voltage is preferably converted with the aid of at least one resistor in the supply line and/or in the charge state indicator device to a supply of the at least one indicator element. The at least one indicator element is preferably supplied via at least two serially connected diodes and the resistor, the diodes being configured to connect a transistor with the aid of the pack voltage in order to thereby apply the pack voltage to the indicator element via the resistor. The diodes are advantageously operated in the forward direction. An advantageously compact and cost-efficient indication of the charge state may be achieved by the design according to the present invention, since expensive additional lines for supplying the indicator elements, in particular, may be omitted.

The indicator device according to the present invention, the rechargeable battery according to the present invention and/or the method according to the present invention is/are not to be limited in this case to the above-described application and specific embodiment. The indicator device according to the present invention, the rechargeable battery according to the present invention and/or the method according to the present invention may, in particular, include a number differing from a number of individual elements, components and units as well as method steps cited herein for fulfilling a functionality described herein. In addition, values also falling within the aforementioned limits for the value ranges specified in this description are also to be considered disclosed and arbitrarily useful.

BRIEF DESCRIPTION OF THE DRAWINGS

Further advantages result from the description below of the figures. Seven exemplary embodiments of the present invention are represented in the figures. The figures and the description herein contain numerous features in combination. Those skilled in the art will also advantageously consider the features individually and combine them to form meaningful further combinations, in view of the disclosure herein.

DETAILED DESCRIPTION OF EXAMPLE EMBODIMENTS

Figure 1:
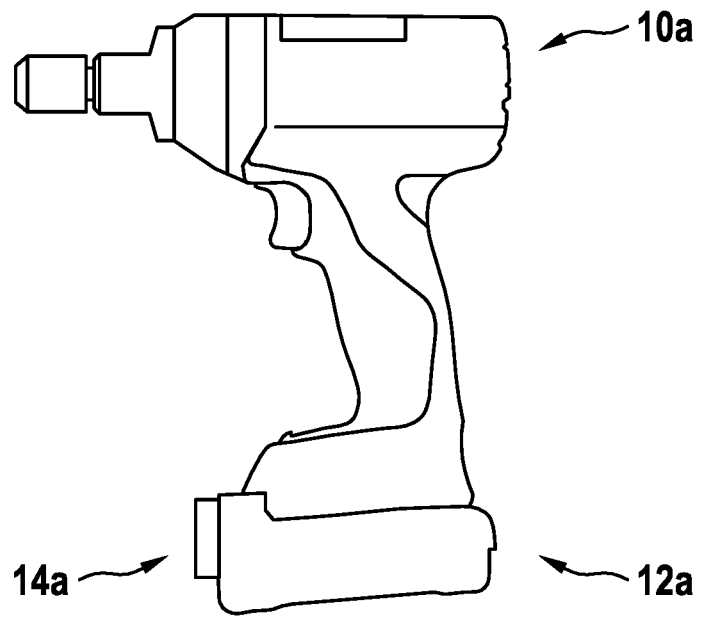
FIG. 1 schematically shows a representation of a power tool including a rechargeable battery pack according to the present invention, including an indicator device according to the present invention.

FIG. 1 schematically shows a representation of a power tool 10a including a replaceable rechargeable battery pack 12a, rechargeable battery pack 12a including an indicator device 14a for indicating a charge state of rechargeable battery pack 12a. Power tool 10a shown is designed as a power drill. It is also possible, however, that power tool 10a is designed as a drill hammer, percussion hammer, saw, plane, screw driver, milling tool, grinder, angle grinder, garden tool, construction site measuring device and/or a multi-functional tool including at least one permanently integrated or replaceable rechargeable battery pack 12a. Rechargeable battery pack 12a is configured to supply power tool 10a with energy.

Figure 2:
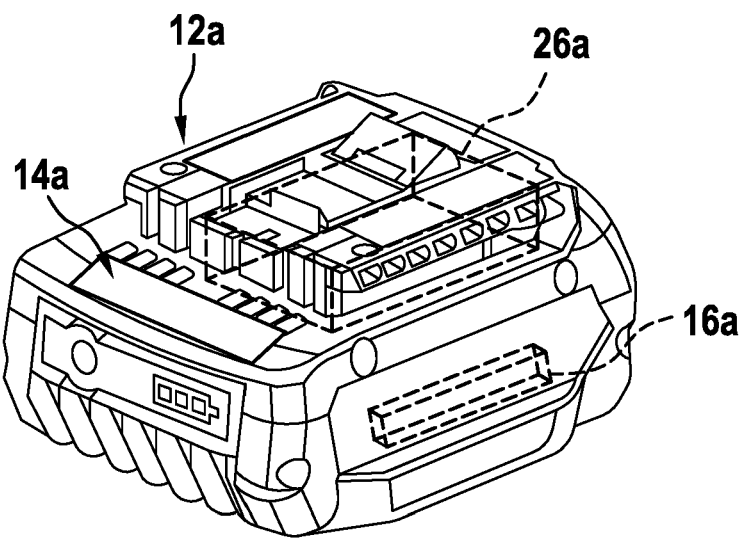
FIG. 2 schematically shows a representation of the rechargeable battery pack according to the present invention, including the indicator device according to the present invention.

FIG. 2 schematically shows a representation of rechargeable battery pack 12a including indicator device 14a for indicating a charge state of rechargeable battery pack 12a. Rechargeable battery pack 12a includes at least one control unit 16a, which is designed, in particular, as main control electronics of rechargeable battery pack 12a, and at least one energy store 26a. Control unit 16a of rechargeable battery pack 12a is advantageously configured to control indicator device 14a with the aid of at least one electrical and/or electronic signal. Control unit 16a of rechargeable battery pack 12a is connected, in particular, conductively, to indicator device 14a and to energy store 26a.

Figure 3:
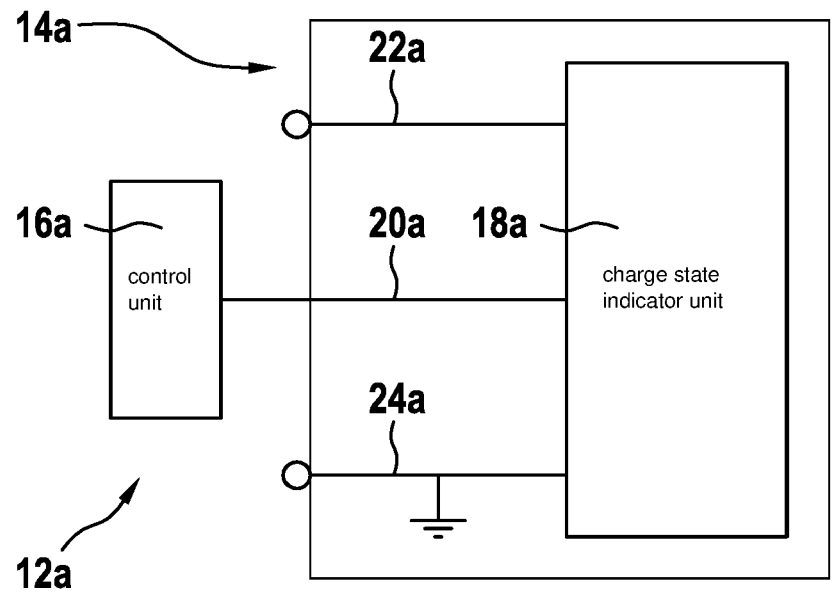
FIG. 3 schematically shows a representation of the indicator device according to the present invention.

FIG. 3 schematically shows a representation of indicator device 14a of rechargeable battery pack 12a. Indicator device 14a includes a charge state indicator unit 18a as well as a control line 20a, a supply line 22a and a ground line 24a. Control line 20a connects control unit 16a of rechargeable battery pack 12a, in particular, conductively, to charge state indicator unit 18a. Ground line 24a is configured to ground at least charge state indicator unit 18a against a zero potential. Ground line 24a is preferably designed as a ground and/or protective conductor net of rechargeable battery pack 12a or of power tool 10a connected to rechargeable battery pack 12a, or as another design that appears meaningful to those skilled in the art. Supply line 22a is configured to provide indicator device 14a with a pack voltage of energy store 26a of rechargeable battery pack 12a, the pack voltage defining, in particular, a charge state of rechargeable battery pack 12a. Supply line 22a is connected, in particular, conductively, to charge state indicator unit 18a. The pack voltage is particularly preferably also present at control unit 16a of rechargeable battery pack 12a which, however, is not depicted in FIG. 3.

Figure 4:
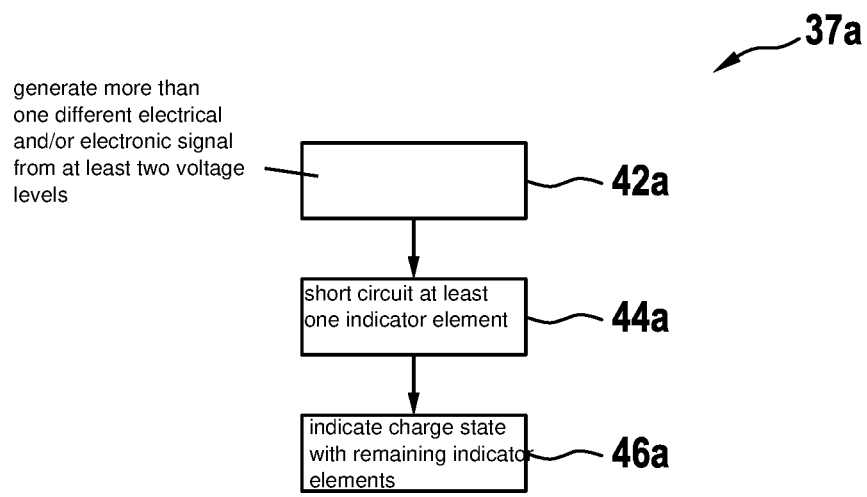
FIG. 4 schematically shows a representation of a sequence of a method according to the present invention using the indicator device according to the present invention.

FIG. 4 schematically shows a representation of a sequence of a method 37a for indicating the charge state of rechargeable battery pack 12a, in particular, using indicator device 14a. In at least one method step 42a of method 37a, at least more than one different electrical and/or electronic signal is generated from at least two voltage levels of control unit 16a of rechargeable battery pack 12a with the aid of at least two control resistors 32a for controlling charge state indicator unit 18a. In at least one method step 44a of method 37a, at least one indicator element 28a, 28a', 28a" of charge state indictor unit 18a is short-circuited as a function of an electrical and/or electronic signal transmitted via control line 20a of control unit 16a of rechargeable battery pack 12a, in particular, of main control electronics of rechargeable battery pack 12a, which is a function, in particular, of a charge state of rechargeable battery pack 12a. In at least one method step 46a of method 37a, an indication of the charge state of rechargeable battery pack 12a takes place with the aid of the remaining, in particular, non-short-circuited indicator elements 28a, 28a', 28a".

Figure 5:
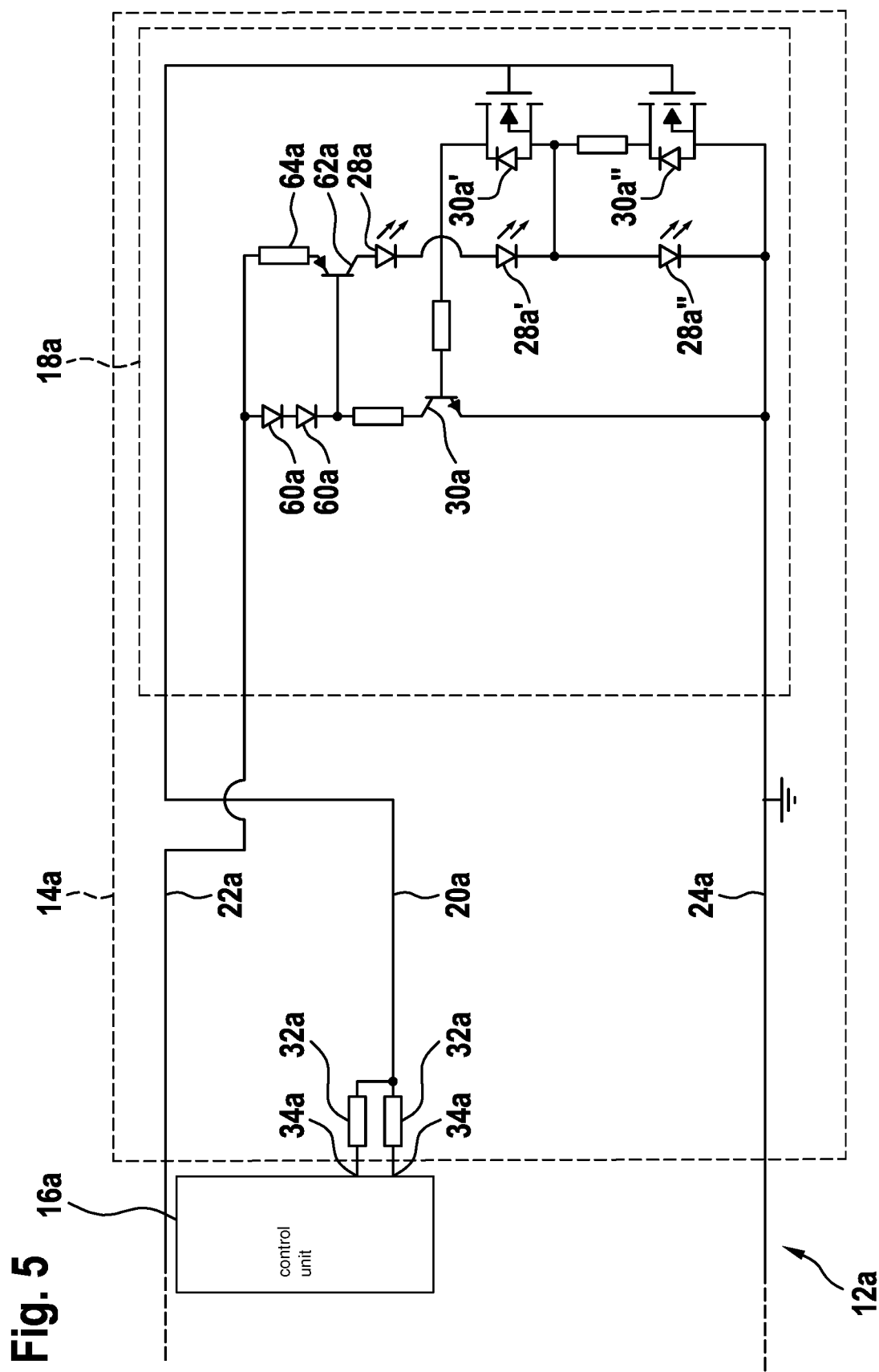
FIG. 5 schematically shows a representation of a circuit diagram of the indicator device according to the present invention.

A schematic representation of a circuit diagram of indicator device 14a of rechargeable battery pack 12a is shown in FIG. 5. Charge state indicator unit 18a includes three indicator elements 28a, 28a', 28a" for indicating the charge state. The three indicator elements 28a, 28a', 28a" are preferably jointly switched on via control unit 16a, in particular, in an at least essentially full charge state of rechargeable battery pack 12a. Charge state indicator unit 18a is configured, in particular, to short-circuit two of the indicator elements 28a', 28a" as a function of the electrical and/or electronic signal transmitted via control line 20a. Indicator elements 28a, 28a', 28a" are designed as light-emitting diodes (LEDs). It is also possible, however, that indicator elements 28a, 28a', 28a" are designed as another design considered meaningful by those skilled in the art. The circuits of indicator device 14a through 14g shown in FIGS. 5 through 11 are, however, particularly preferably configured for indicator elements 28a, 28a', 28a" designed as light-emitting diodes. Charge state indicator unit 18a includes multiple transistor elements 30a, 30a', 30a", 62a. Charge state indicator unit 18a includes a first transistor element 30a, a second transistor element 30a', a third transistor element 30a" and a further transistor element 62a. First transistor element 30a is preferably configured to regulate the current for all three indicator elements 28a, 28a', 28a" via further transistor element 62a. Second and third transistor elements 30a', 30a" of charge state indicator unit 18a are each situated so as to be connected in parallel to one of indicator elements 28a', 28a" and are configured to short-circuit one each of indicator elements 28a', 28a" as a function of the electrical and/or electronic signal transmitted via control line 20a, in particular, as a function of the charge state of rechargeable battery pack 12a. Second and third transistor elements 30a', 30a", which are preferably configured to short-circuit the two indicator elements 28a', 28a", are designed as field-effect transistors. First and further transistor element 30a, 62a, which are provided to regulate the current for indicator elements 28a, 28a', 28a", are designed as complementary bipolar transistors. It is also possible, however, that transistor elements 30a, 30a', 30a", 62a are designed as conventional transistors and/or as another design that appears meaningful to those skilled in the art. In the case of a decreasing pack voltage of rechargeable battery pack 12a, second and third transistor elements 30a', 30a" are gradually connected via control unit 16a and in this way indicator elements 28a', 28a" are gradually short-circuited, as a result of which indicator elements 28a', 28a" are at least essentially without current switched off. In the case of a further decreasing pack voltage, transistor element 30a is preferably de-energized, as a result of which last remaining indicator element 28a is de-energized.

A power supply to indicator elements 28a, 28a', 28a" takes place via supply line 22a with the aid of two diodes 60a, further transistor element 62a and a resistor 64a. A circuit including indicator elements 28a, 28a', 28a" is, in particular, closed via a connection of further transistor element 62a. If a voltage level is present at control line 20a, the power supply of indicator elements 28a, 28a', 28a" is activated via first transistor element 30a. Second and third transistor element 30a', 30a" are connected at a higher voltage level of control line 20a, in particular, in order to short-circuit indicator elements 30a', 30a" as a function of the charge state of rechargeable battery pack 12a.

Control line 20a includes two control resistors 32a electro-conductively connected to control line 20a, each of which is directly connected to a signal output 34a of control unit 16a of rechargeable battery pack 12a. Control resistors 32a are preferably configured to generate exactly four different electrical and/or electronic signals, in particular, exactly four different voltage levels, from two voltage levels of control unit 16a of rechargeable battery pack 12a for controlling charge state indicator unit 18a. Control unit 16a is preferably configured in such a way that the voltage level at signal outputs 34a change as a function of the pack voltage, in particular, in order to control charge state indicator unit 18a. Alternatively, it is possible that the signal generation instead of via the two control resistors 32a, the electrical and/or electronic signal for controlling charge state indicator unit 18a is generated via a resistor connected to a signal output 34a of control unit 16a and via a capacitor situated between ground line 24a and control line 20a. Charge state indicator unit 18a is preferably connected to the rest of the electronics of rechargeable battery pack 12a solely via the one supply line 22a, via the one control line 20a and via the one ground line 24a.

The resistors of indicator device 14a unmarked in FIG. 5 are at least largely configured to change, in particular, to adapt the electrical and/or electronic signal of control unit 16a and/or the pack voltage of rechargeable battery pack 12a in such a way that as a result of the different voltage levels, the different transistor elements 30a, 30a', 30a'', 62a may be connected as a function of the charge state of rechargeable battery pack 12a and/or the pack voltage may be adapted for supplying indicator elements 28a, 28a', 28a''.

Further exemplary embodiments of the present invention are shown in FIGS. 6 through 11. The following descriptions and the drawings are limited essentially to the differences between the exemplary embodiments, whereby in terms of similarly identified components, in particular, in terms of components having the same reference numeral, reference may be made, in principle also to the drawings and/or to the description of the other exemplary embodiments, in particular of FIGS. 1 through 5. To distinguish between the exemplary embodiments, the letter a is placed after the reference numerals of the exemplary embodiment in FIGS. 1 through 5. The letter a is replaced by the letters b through g in the exemplary embodiments of FIGS. 6 through 11.

Figure 6:
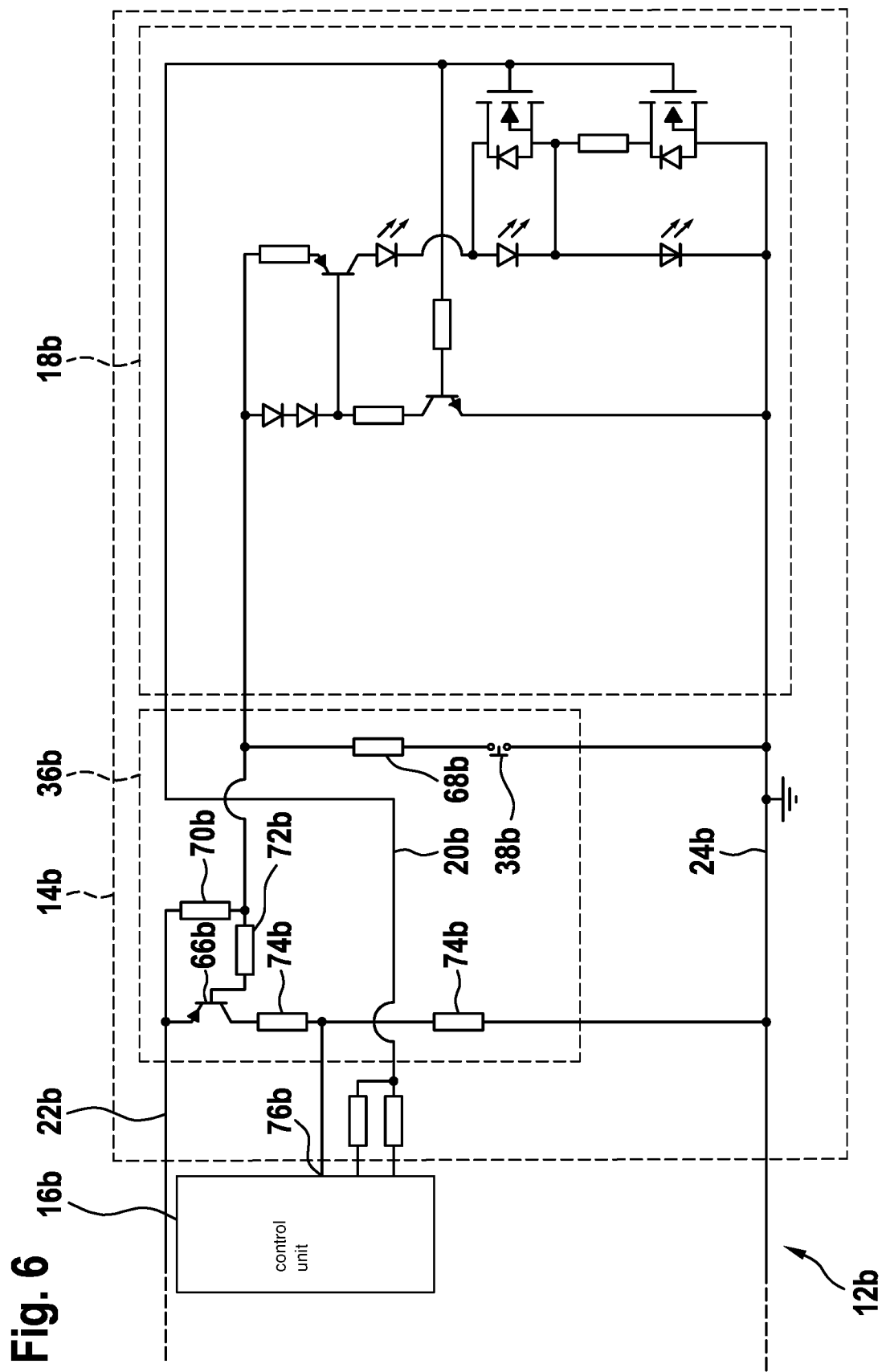
FIG. 6 schematically shows a representation of a circuit diagram of a first alternative indicator device according to the present invention, including a schematic diagram.

A representation of a circuit diagram of a first alternative indicator device 14b of a rechargeable battery pack 12b is schematically shown in FIG. 6. Indicator device 14b is designed to be at least largely structurally identical to indicator device 14a, however, indicator device 14b also includes an operating unit 36b. Operating unit 36b includes an operating element 38b, which is configured to activate a charge state indicator unit 18b of indicator device 14b via a control unit 16b of rechargeable battery pack 12b, in particular, via main control electronics of rechargeable battery pack 12b. Operating element 38b is designed as a push button. It is also possible, however, that operating element 38b is designed as a switch, lever and/or as another design that appears meaningful to those skilled in the art. Operating unit 36b further includes a transistor 66b and five additional resistors 68b, 70b, 72b, 74b, via which a supply line 22b of indicator device 14b is connected to control unit 16b of rechargeable battery pack 12b and to a ground line 24b of indicator device 14b. Operating element 38b and resistor 68b of operating unit 36b are advantageously situated together with charge state indicator unit 18b, in particular, on a circuit board of indicator device 14b. The circuit board including charge state indicator unit 18b as well as operating element 38b and resistor 68b of operating unit 36b are preferably connected to the rest of the electronics of rechargeable battery pack 12b solely via the one supply line 22b, via the one control line 20b and via the one ground line 24b.

If operating element 38b is actuated, a current flows via operating element 38b, resistors 68b, 70b and a portion of supply line 22b. This causes a voltage drop at resistor 70b. As a result of this voltage drop, transistor 66b is connected via resistor 72b and resistors 74b of operating unit 36b act as voltage dividers, a current flowing via the voltage divider being identified as a signal at a signal input 76b of control unit 16b of rechargeable battery pack 12b.

Figure 7:
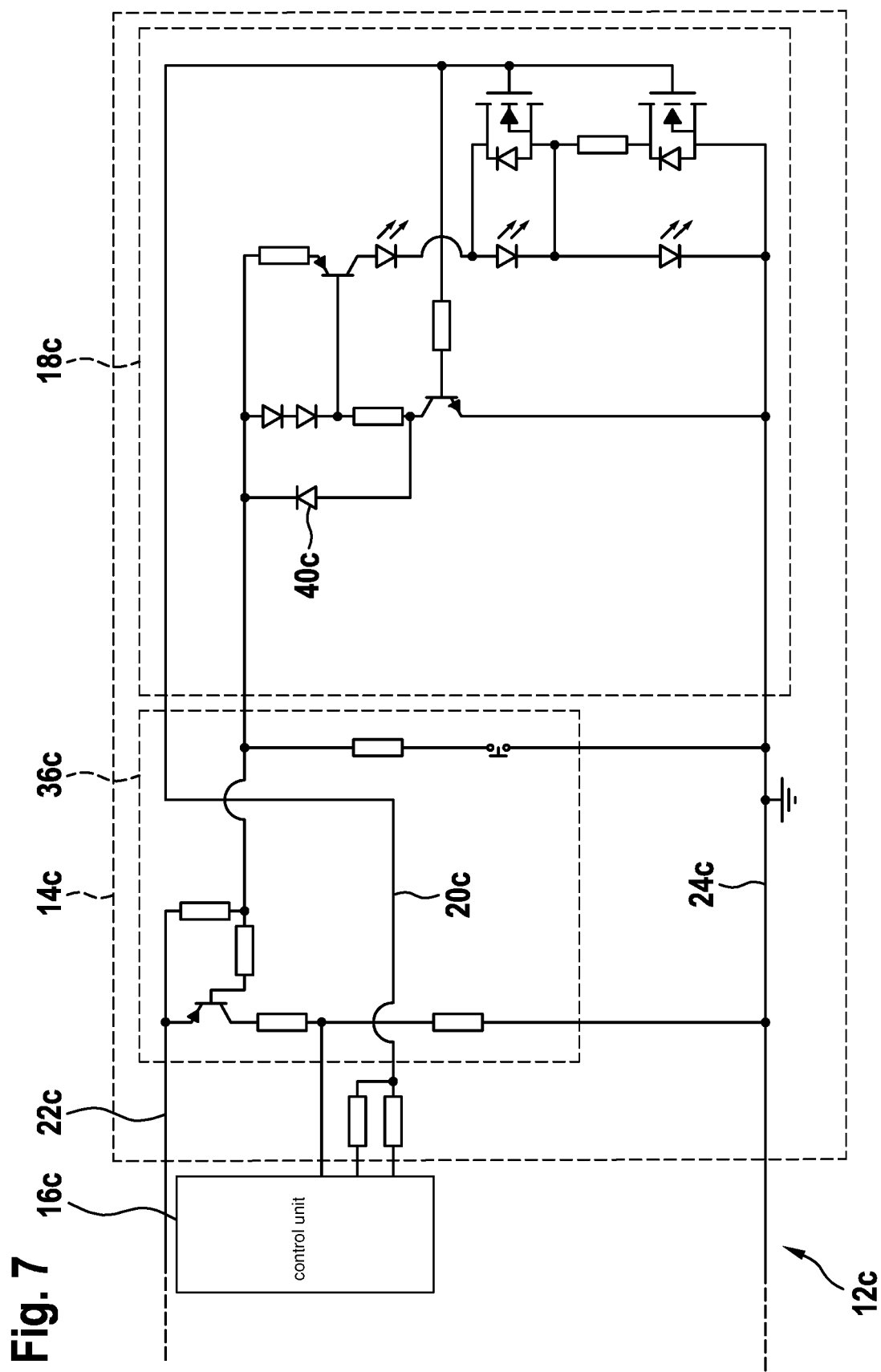
FIG. 7 schematically shows a representation of a circuit diagram of a second alternative indicator device according to the present invention.

A representation of a circuit diagram of a second alternative indicator device 14c of a rechargeable battery pack 12c is schematically shown in FIG. 7. Indicator device 14c is designed at least largely structurally identically to indicator device 14b, however, a charge state indicator unit 18c of indicator device 14c also includes a voltage stabilizing unit 40c designed as a Zener diode. Voltage stabilizing unit 40c is designed between a supply line 22c of indicator device 14c and the rest of charge state indicator unit 18c. Voltage stabilizing unit 40c is preferably configured to reduce a dipping thermal power of charge state indicator unit 18c. Voltage stabilizing unit 40c is preferably configured to prevent a current flow in an idle state of charge state indicator unit 18c. Voltage stabilizing unit 40c designed as a Zener diode is advantageously situated in the reverse direction with respect to supply line 22c.

Figure 8:
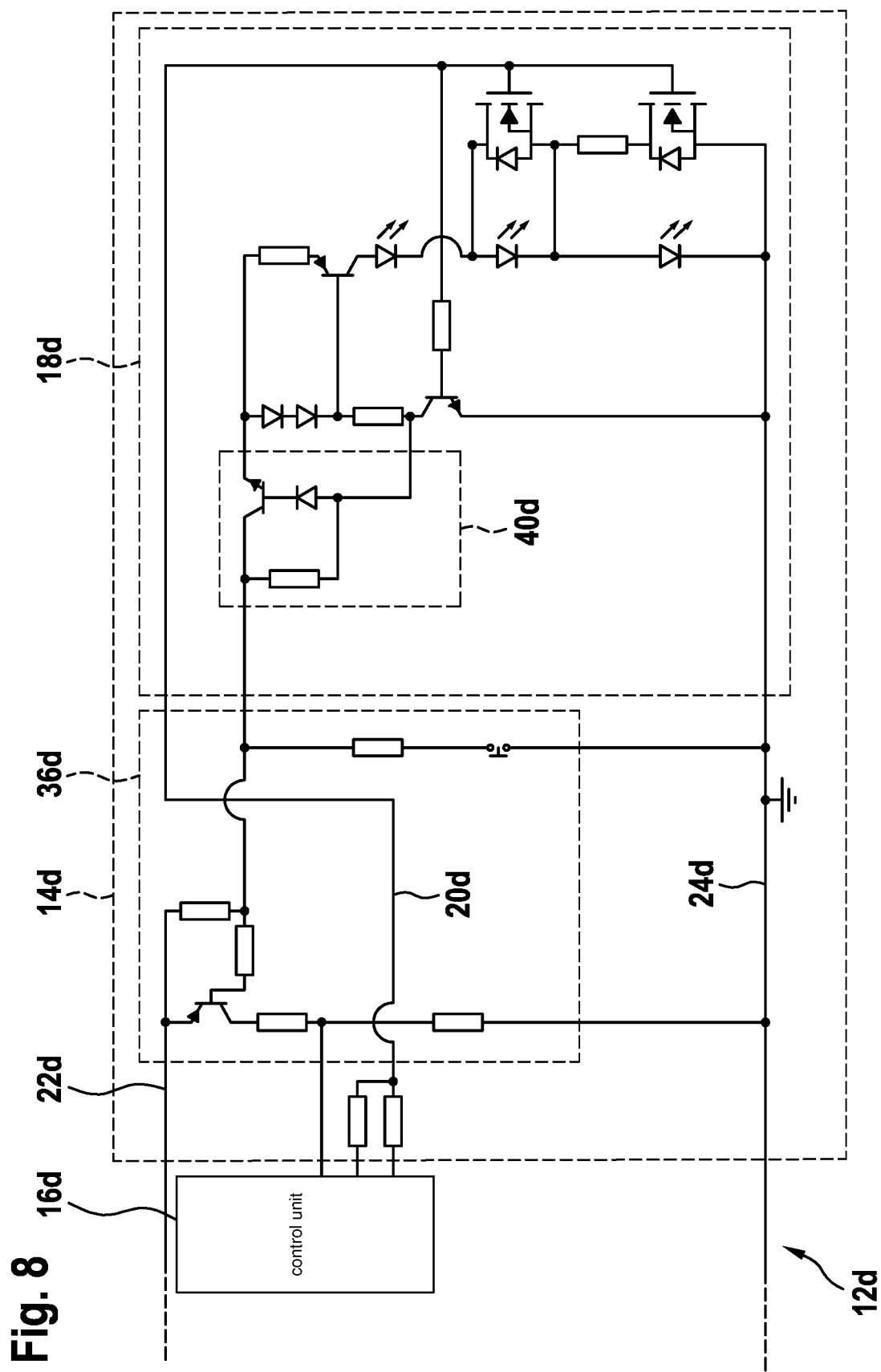
FIG. 8 schematically shows a representation of a circuit diagram of a third alternative indicator device according to the present invention.

FIG. 8 schematically shows a circuit diagram of a third alternative indicator device 14d of a rechargeable battery pack 12d. Indicator device 14d is designed at least largely structurally identical to indicator device 14c, however, a voltage stabilization unit 40d of indicator device 14d also includes, in addition to a Zener diode, a transistor and a resistor connected in parallel to the Zener diode. The transistor is preferably connected via the resistor and the Zener diode, as a result of which a pack voltage of rechargeable battery pack 12d is present at the rest of charge state indicator unit 18d when the transistor is connected.

Figure 9:
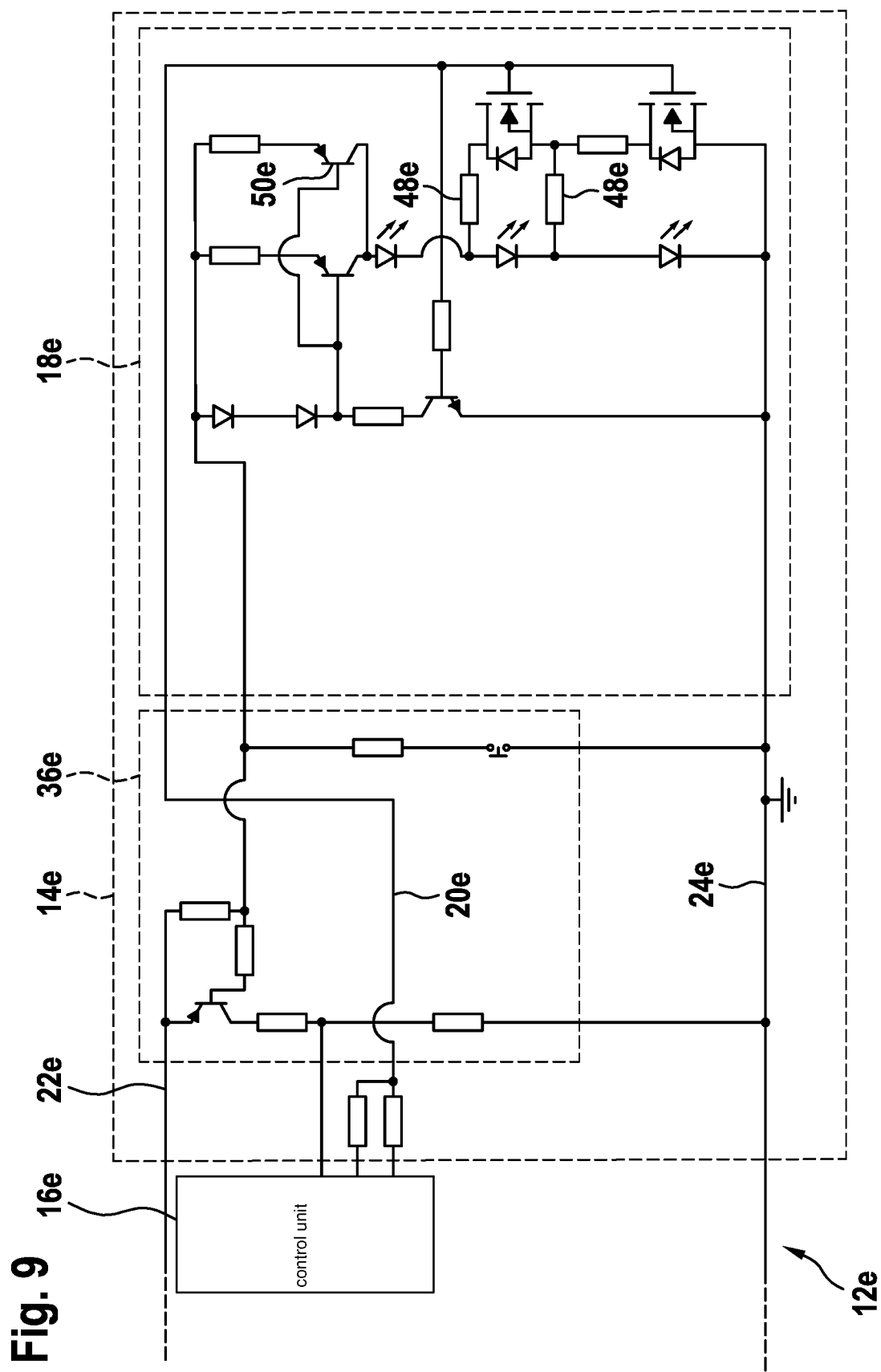
FIG. 9 schematically shows a representation of a circuit diagram of a fourth alternative indicator device according to the present invention.

FIG. 9 schematically shows a representation of a circuit diagram of a fourth alternative indicator device 14e of a rechargeable battery pack 12e. Indicator device 14e is designed at least largely structurally identical to indicator device 14b, however, a charge state indicator unit 18e of indicator device 14e also includes two redistribution resistors 48e. Redistribution resistors 48e are situated in a conductor mesh of one each of an indicator element 28e of charge state indicator unit 18e. Redistribution resistors 48e are configured to distribute dipping power as heat within indicator device 14e to multiple points, in particular, to avoid a local overheating within rechargeable battery pack 12e. Charge state indicator unit 18e includes a further transistor 50e, which is configured to distribute an electrical current to a supply of indicator elements 28e and, in this way also to distribute a dipping power as heat to multiple points within indicator device 14e.

Figure 10:
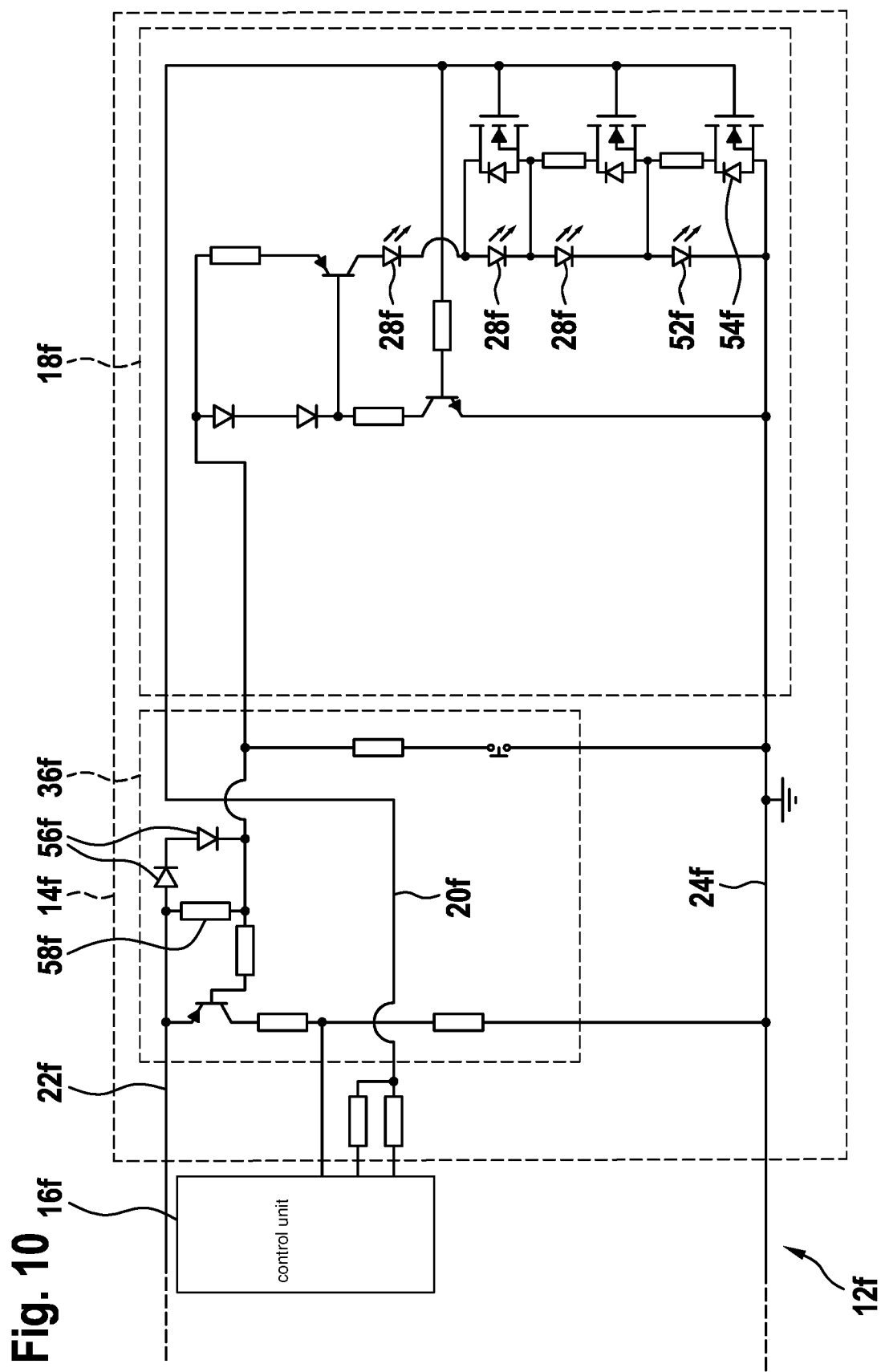
FIG. 10 schematically shows a representation of a circuit diagram of a fifth alternative indicator device according to the present invention.

FIG. 10 schematically shows a representation of a circuit diagram of a fifth alternative indicator device 14f of a rechargeable battery pack 12f. Indicator device 14f is designed at least largely structurally identical to indicator device 14b, however, a charge state indicator unit 18f of indicator device 14f includes a total of four indicator elements 28f, 52f designed as light-emitting diodes. Compared to indicator device 14b, charge state indicator unit 18f also includes a further indicator element 52f and a further transistor element 54f, which is configured to short-circuit further indicator element 52f as a function of an electrical and/or electronic signal of a control unit 16f of rechargeable battery pack 12f. An operating unit 36f of indicator device 14f also includes two diodes 56f, which are configured to limit a voltage drop via resistor 58f of operating unit 36f connected in parallel to the two diodes 56f.

Figure 11:
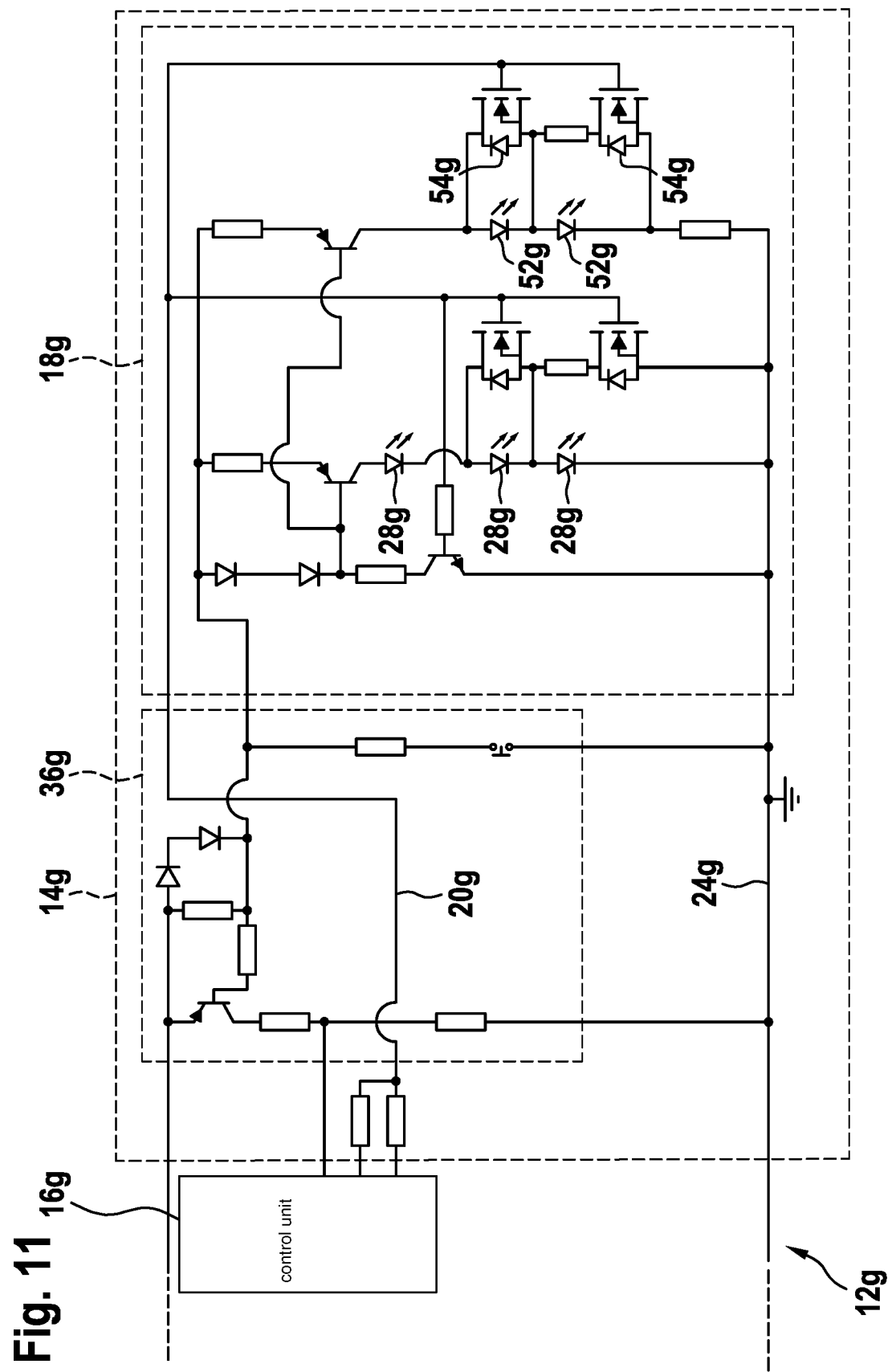
FIG. 11 schematically shows a representation of a circuit diagram of a sixth alternative indicator device according to the present invention.

A representation of a circuit diagram of a sixth alternative indicator device 14g of a rechargeable battery pack 12g is schematically shown in FIG. 11. Indicator device 14g is designed at least largely structurally identical to indicator device 14f, however, a charge state indicator unit 18g of indicator device 14g includes a total of five indicator elements 28g, 52g designed as light-emitting diodes. The further indicator elements 52g are situated so as to be connected in parallel to the remaining three indicator elements 28g. It may be, in particular, that from a particular number of serially connected indicator elements 28g, a pack voltage of rechargeable battery pack 12g is no longer sufficient for supplying indicator elements 28g, 52g with a sufficiently high voltage. For the two further indicator elements 52g, charge state indicator unit 18g includes in each case a further transistor element 54g, which is configured to short-circuit further indicator element 52g in a conductor mesh of respective transistor element 54g as a function of an electrical and/or electronic signal of a control unit 16g of rechargeable battery pack 12g.

What is claimed is:

1. An indicator device for a rechargeable battery pack for indicating a charge state of the rechargeable battery pack, comprising:
    at least one charge state indicator unit which includes at least one indicator element configured to indicate the charge state of the rechargeable battery pack; and
    at least one control line configured to transmit at least one electrical and/or electronic signal, as a function of a charge state of the rechargeable battery pack, from a separate control unit to the charge state indicator unit, the control unit being structurally separate and spatially separated from the charge state indicator unit;
    wherein the charge state indicator unit is configured to short-circuit at least one indicator element of the at least one indicator element as a function of the electrical and/or electronic signal transmitted via the control line,
    wherein the charge state indicator unit includes at least one redistribution resistor which is configured to distribute a power drop within the charge state indicator unit, the redistribution resistor being situated between the indicator element and a transistor element of the charge state indicator unit.

2. The indicator device as recited in claim 1, wherein the control unit is of main control electronics of the rechargeable battery pack.

3. The indicator device as recited in claim 1, wherein the indicator device is for a rechargeable battery pack of a power tool.

4. The indicator device as recited in claim 1, wherein the at least one transistor element is situated so as to be connected in parallel to the indicator element.

5. The indicator device as recited in claim 1, further comprising:
    at least two control resistors electro-conductively connected to the control line, each of the at least two control resistors being connected directly to at least one signal output of the control unit of the rechargeable battery pack.

6. The indicator device as recited in claim 1, further comprising:
    at least one operating unit which includes at least one operating element, which is configured to activate the charge state indicator unit via the control unit of the rechargeable battery pack.

7. The indicator device as recited in claim 1, wherein the charge state indicator unit includes at least one voltage stabilization unit which includes at least one Zener diode.

8. The method as recited in claim 1, further comprising:
    generating at least more than one different electrical and/or electronic signal for controlling the charge state indicator unit from at least two voltage levels of the control unit of the rechargeable battery pack using at least two control resistors.

9. The method as recited in claim 8, wherein the short-circuiting of the indicator element takes place via at least one transistor element of the charge state indicator unit, which is connected as a function of the electrical and/or electronic signal of the control unit of the rechargeable battery pack.

10. The method as recited in claim 8, wherein the charge state indicator unit is supplied with current via at least one supply line using at least one pack voltage of the rechargeable battery pack.

* * * * *